(12) United States Patent
Huang

(10) Patent No.: US 8,836,417 B2
(45) Date of Patent: Sep. 16, 2014

(54) CHARGE-DOMAIN FILTER AND METHOD THEREOF AND CLOCK GENERATOR

(71) Applicant: Industrial Technology Research Institute, Hsinchu (TW)

(72) Inventor: Ming-Feng Huang, Hsinchu County (TW)

(73) Assignee: Industrial Technology Research Institute, Hsinchu (TW)

(\*) Notice: Subject to any disclaimer, the term of this patent is extended or adjusted under 35 U.S.C. 154(b) by 0 days.

(21) Appl. No.: 14/014,364

(22) Filed: Aug. 30, 2013

(65) Prior Publication Data

US 2014/0002165 A1 Jan. 2, 2014

Related U.S. Application Data

(62) Division of application No. 13/335,945, filed on Dec. 23, 2011, now Pat. No. 8,558,607.

(30) Foreign Application Priority Data

Nov. 16, 2011 (TW) .............................. 100141848 A

(51) Int. Cl.
*H03B 1/00* (2006.01)
*H03H 21/00* (2006.01)
*H03H 19/00* (2006.01)
*H03K 5/15* (2006.01)
*H03H 15/00* (2006.01)

(52) U.S. Cl.
CPC ......... *H03H 21/0007* (2013.01); *H03H 19/004* (2013.01); *H03K 5/1502* (2013.01); *H03H 2015/007* (2013.01); *H03H 15/023* (2013.01)
USPC ...................................................... 327/554

(58) Field of Classification Search
USPC .......... 327/291, 293–296, 298, 299, 551–554
See application file for complete search history.

(56) References Cited

U.S. PATENT DOCUMENTS 8,044,701 B1 \* 10/2011 Greenberg .................... 327/337

\* cited by examiner

*Primary Examiner* — Sibin Chen
(74) *Attorney, Agent, or Firm* — Jianq Chyun IP Office

(57) ABSTRACT

A charge domain filter (CDF) is provided. The CDF includes a switched-capacitor network (SCN) and a clock generator. An input of the SCN receives an input signal. The SCN samples the input signal according to clock signals with different phases. The clock generator is coupled to the SCN for providing the clock signals. The clock generator adjusts phase differences of the clock signals or pulse widths of the clock signals in accordance with a control signal.

23 Claims, 13 Drawing Sheets

CHARGE-DOMAIN FILTER AND METHOD THEREOF AND CLOCK GENERATOR

CROSS-REFERENCE TO RELATED APPLICATION

This application is a Divisional of and claims the priority benefit of U.S. patent application Ser. No. 13/335,945, filed on Dec. 23, 2011, now allowed, which claims the priority benefits of Taiwan application Serial No. 100141848, filed on Nov. 16, 2011. The entirety of each of the above-mentioned patent applications is hereby incorporated by reference herein and made a part of this specification.

TECHNICAL FIELD

The technical field relates to a charge-domain filter (CDF) and a method thereof and a clock generator.

BACKGROUND

A charge-domain filter (CDF) uses a filter technique of a switched-capacitor network (SCN). The SCN is a commonly used circuit in discrete time signal processing, which includes a plurality of switches and a plurality of capacitors. By turning on/off the switches, the CDF controls a charge storage status of the capacitors, so as to perform filter processing on an input signal. Compared to a capacitive-resistive analog filter circuit, a filtering effect of the SCN is mainly determined by size ratios of the capacitors therein. Even if an area of each capacitor is changed due to process variation, since the size ratios of the capacitors are ideally not changed along with the process variation, the filtering effect of the SCN is not changed. Therefore, the SCN is suitable to be fabricated in chips.

However, since the CDF may perform charge samplings, the process variation may lead to a gain variation and a direct current (DC) offset. If the DC offset is severe, a variable gain amplifier (VGA) of an analog to digital converter (ADC) in a receiver is hard to maintain a constant gain. On the other hand, a sampling pulse of the CDF relates to an input sampling rate, which means that a pulse width is inversely proportional to the input sampling rate. Therefore, based on a same finite impulse response (FIR) coefficient of the CDF, a narrow band CDF may cause a positive gain variation, and a wide band CDF may cause a gain loss.

SUMMARY OF THE DISCLOSURE

An exemplary embodiment of the disclosure provides a charge-domain filter (CDF) including a switched-capacitor network (SCN) and a clock generator. An input terminal of the SCN receives an input signal. The SCN samples the input signal according to a plurality of clock signals, where the clock signals have different phases. The clock generator is coupled to the SCN for providing the clock signals. The clock generator adjusts phase differences of the clock signals according to a first control signal or adjusts pulse widths of the clock signals according to a second control signal. The clock generator comprises a first clock generator or a second clock generator. The first clock generator comprises N unit pulse cells UPC_1-UPC_N connected in series, wherein in the first clock generator, an $i^{th}$ unit pulse cell UPC_i samples an $(i-1)^{th}$ delay clock output by an $(i-1)^{th}$ unit pulse cell UPC_(i-1) according to a first frequency, so as to obtain an $i^{th}$ clock signal $clk_i$ of the clock signals, the $i^{th}$ unit pulse cell UPC_i outputs the $i^{th}$ clock signal $clk_i$ to the switched-capacitor network, the $i^{th}$ unit pulse cell UPC_i delays the $i^{th}$ clock signal $clk_i$ according to the first control signal to obtain an $i^{th}$ delay clock, and the $i^{th}$ unit pulse cell UPC_i outputs the $i^{th}$ delay clock to an $(i+1)^{th}$ unit pulse cell UPC_(i+1). The second clock generator comprises N unit pulse cells UPC_1-UPC_N and N programmable width cells PWC_1-PWC_N. The unit pulse cells UPC_1-UPC_N of the second clock generator are connected in series. In the second clock generator, an $i^{th}$ unit pulse cell UPC_i samples an $(i-1)^{th}$ pulse signal output by an $(i-1)^{th}$ unit pulse cell UPC_(i-1) according to a first frequency, so as to obtain an $i^{th}$ pulse signal, and the $i^{th}$ unit pulse cell UPC_i outputs the $i^{th}$ pulse signal to an $(i+1)^{th}$ unit pulse cell UPC_(i+1). In the second clock generator, an $i^{th}$ programmable width cell PWC_i is coupled to the $i^{th}$ unit pulse cell UPC_i for receiving the $i^{th}$ pulse signal, the $i^{th}$ programmable width cell PWC_i adjusts a pulse width of the $i^{th}$ pulse signal according to the second control signal, so as to obtain an $i^{th}$ clock signal $clk_i$ of the clock signals, and the $i^{th}$ programmable width cell PWC_i outputs the $i^{th}$ clock signal $clk_i$ to the switched-capacitor network.

Another exemplary embodiment of the disclosure provides a clock generator, adapted to generate a plurality of clock signals. The clock generator includes a first clock generator or a second clock generator. The first clock generator comprises N unit pulse cells UPC_1-UPC_N connected in series, wherein in the first clock generator, an $i^{th}$ unit pulse cell UPC_i samples an $(i-1)^{th}$ delay clock output by an $(i-1)^{th}$ unit pulse cell UPC_(i-1) according to a first frequency, so as to obtain an $i^{th}$ clock signal $clk_i$ of the clock signals, the $i^{th}$ unit pulse cell UPC_i outputs the $i^{th}$ clock signal $clk_i$ to the switched-capacitor network, the $i^{th}$ unit pulse cell UPC_i delays the $i^{th}$ clock signal $clk_i$ according to the first control signal to obtain an $i^{th}$ delay clock, and the $i^{th}$ unit pulse cell UPC_i outputs the $i^{th}$ delay clock to an $(i+1)^{th}$ unit pulse cell UPC_(i+1). The second clock generator comprises N unit pulse cells UPC_1-UPC_N and N programmable width cells PWC_1-PWC_N. The unit pulse cells UPC_1-UPC_N of the second clock generator are connected in series. In the second clock generator, an $i^{th}$ unit pulse cell UPC_i samples an $(i-1)^{th}$ pulse signal output by an $(i-1)^{th}$ unit pulse cell UPC_(i-1) according to a first frequency, so as to obtain an $i^{th}$ pulse signal. The $i^{th}$ unit pulse cell UPC_i of the second clock generator outputs the $i^{th}$ pulse signal to an $(i+1)^{th}$ unit pulse cell UPC_(i+1). In the second clock generator, an $i^{th}$ programmable width cell PWC_i is coupled to the $i^{th}$ unit pulse cell UPC_i for receiving the $i^{th}$ pulse signal. The $i^{th}$ programmable width cell PWC_i of the second clock generator adjusts a pulse width of the $i^{th}$ pulse signal according to a second control signal, so as to obtain an $i^{th}$ clock signal $clk_i$ of the clock signals.

Another exemplary embodiment of the disclosure provides a charge-domain filtering method including following steps. A SCN receives an input signal, and the input signal is sampled according to a plurality of clock signals, where the clock signals have different phases. Phase differences and pulse widths of the clock signals generated by a clock generator are adjusted according to at least one control signal. Wherein, the clock generator comprises a first clock generator or a second clock generator. The first clock generator comprises N unit pulse cells UPC_1-UPC_N connected in series, wherein in the first clock generator, an $i^{th}$ unit pulse cell UPC_i samples an $(i-1)^{th}$ delay clock output by an $(i-1)^{th}$ unit pulse cell UPC_(i-1) according to a first frequency, so as to obtain an $i^{th}$ clock signal $clk_i$ of the clock signals, the $i^{th}$ unit pulse cell UPC_i outputs the $i^{th}$ clock signal $clk_i$ to the switched-capacitor network, the $i^{th}$ unit pulse cell UPC_i delays the $i^{th}$ clock signal $clk_i$ according to the first control signal to obtain an $i^{th}$ delay clock, and the $i^{th}$ unit pulse cell UPC_i outputs the $i^{th}$ delay clock to an $(i+1)^{th}$ unit pulse cell UPC_(i+1). The second clock generator comprises N unit pulse cells UPC_1-UPC_N and N programmable width cells PWC_1-PWC_N. The unit pulse cells UPC_1-UPC_N are connected in series, wherein in the second clock generator, an $i^{th}$ unit pulse cell UPC_i samples an $(i-1)^{th}$ pulse signal output by an $(i-1)^{th}$ unit pulse cell UPC_(i-1) according to a first frequency, so as to obtain an $i^{th}$ pulse signal, and the $i^{th}$ unit pulse cell UPC_i outputs the $i^{th}$ pulse signal to an $(i+1)^{th}$ unit pulse cell UPC_(i+1). In the second clock generator, an $i^{th}$ programmable width cell PWC_i is coupled to the $i^{th}$ unit pulse cell UPC_i for receiving the $i^{th}$ pulse signal, the $i^{th}$ programmable width cell PWC_i adjusts a pulse width of the $i^{th}$ pulse signal according to the second control signal, so as to obtain an $i^{th}$ clock signal $clk_i$ of the clock signals, and the $i^{th}$ programmable width cell PWC_i outputs the $i^{th}$ clock signal $clk_i$ to the switched-capacitor network.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate embodiments and, together with the description, serve to explain the principles of the disclosure.

DETAILED DESCRIPTION OF DISCLOSED EMBODIMENTS

Figure 1:
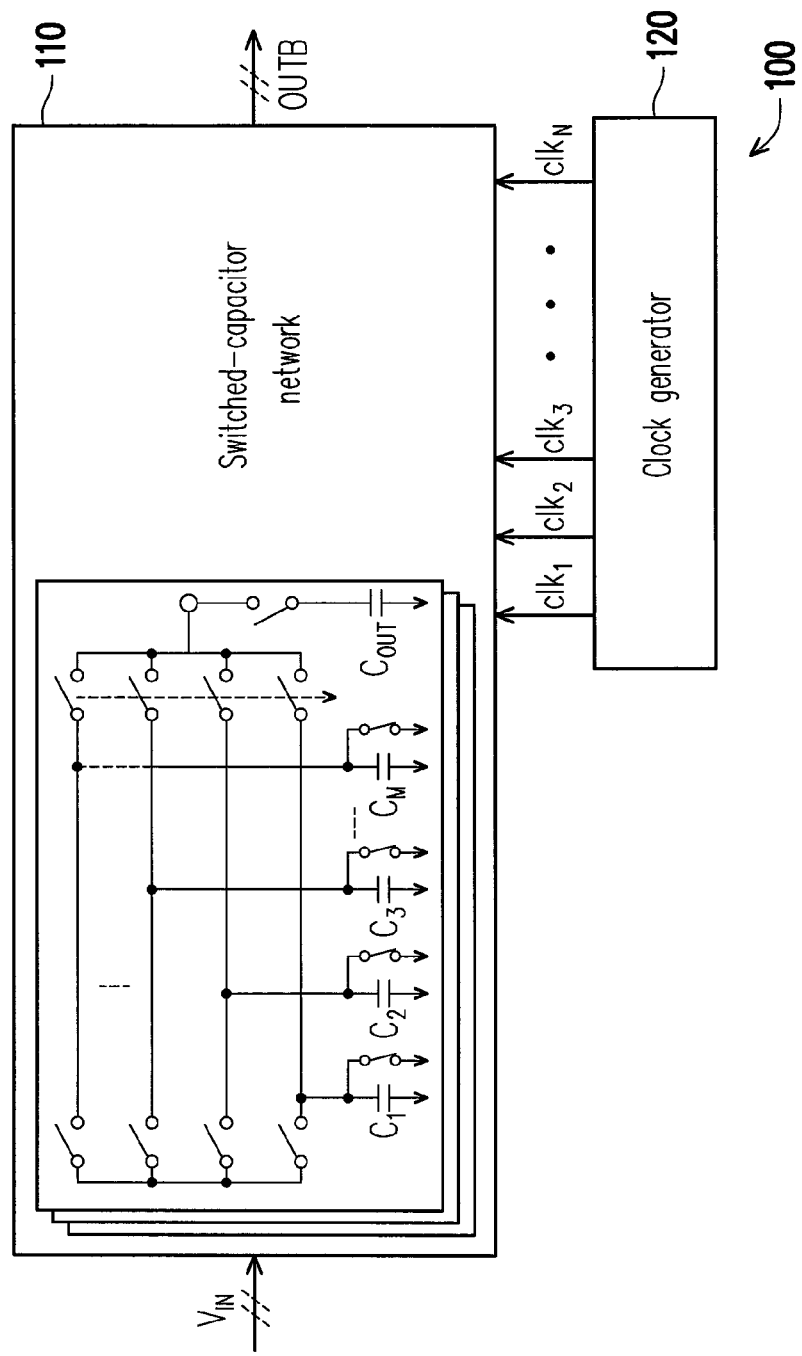
FIG. 1 is a functional block schematic diagram of a charge-domain filter (CDF) according to an embodiment of the disclosure.

FIG. 1 is a functional block schematic diagram of a charge-domain filter (CDF) 100 according to an embodiment of the disclosure. The CDF 100 includes a switched-capacitor network (SCN) 110 and a clock generator 120. The clock generator 120 is coupled to the SCN 110 for providing N clock signals $clk_1$, $clk_2$, $clk_3$, ..., $clk_N$. An input terminal of the SCN 110 receives an input signal $V_{IN}$. The SCN 110 samples the input signal $V_{IN}$ according to the clock signals $clk_1$-$clk_N$, where the clock signals $clk_1$-$clk_N$ have different phases. The SCN 110 filters the input signal $V_{IN}$ according to a discrete time signal processing method, and outputs a filtering result OUTB. Namely, by turning on/off a plurality of internal switches, the SCN 110 controls a charge storage status of internal capacitors, so as to perform the filter processing on the input signal $V_{IN}$.

Figure 2:
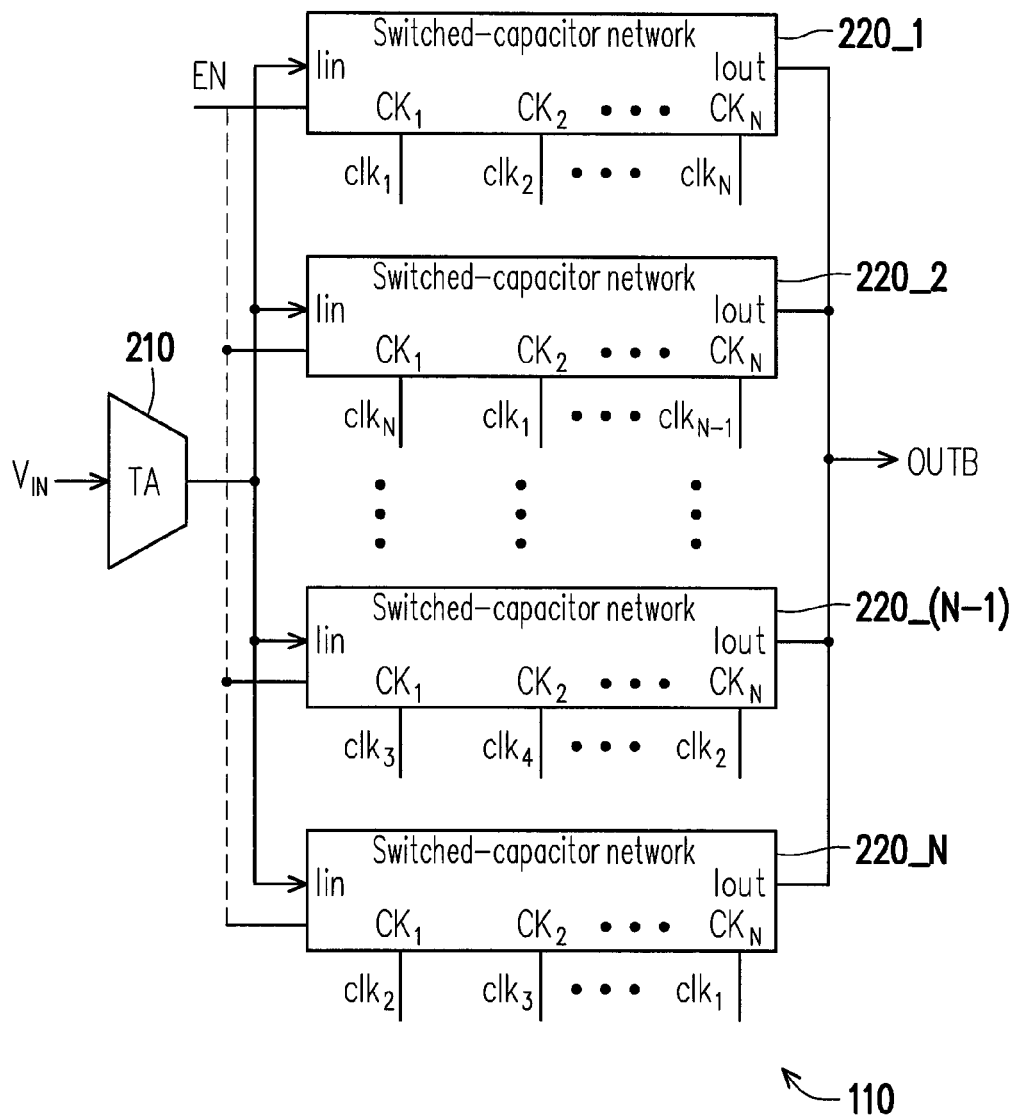
FIG. 2 is a functional block schematic diagram of a switched-capacitor network of FIG. 1 according to an embodiment of the disclosure.

Any SCN or any CDF can be used to implement the aforementioned SCN 110. For example, FIG. 2 is a functional block schematic diagram of the SCN 110 of FIG. 1 according to an embodiment of the disclosure. The SCN 110 includes an amplifier 210 and SCNs 220_1, 220_2, ..., 220_(N-1), 220_N. The amplifier 210 can be a transconductance amplifier (TA) or an operation amplifier (OP-AMP) or other amplifiers. An input terminal of the amplifier 210 receives the input signal $V_{IN}$, and an output terminal of the amplifier 210 is connected to input terminals of the SCNs 220_1-220_N. The SCNs 220_1-220_N are unnecessary to be implemented by a same type of circuits. For example, the SCNs 220_1-220_N can be a clock-efficient charge-domain filter (CECDF). Different filtering effects are achieved by designing a structure of the SCNs 220_1-220_N in the CDF 100.

In the present embodiment, a tap-length of the SCNs 220_1-220_N is N. Namely, the SCNs 220_1-220_N respectively have N clock input terminals $CK_1$, $CK_2$, ..., $CK_N$ for receiving the clock signals $clk_1$-$clk_N$. The clock generator 120 provides the clock signals $clk_1$-$clk_N$ to the SCNs 220_1-220_N, where the clock signals $clk_1$-$clk_N$ have different phases. Each of the SCNs receives the clock signals $clk_1$-$clk_N$ in a different sequence. For example, the clock input terminals $CK_1$-$CK_N$ of the SCN 220_1 respectively receive the clock signal $clk_1$, $clk_2$, ..., $clk_N$, and the clock input terminals $CK_1$-$CK_N$ of the SCN 220_2 respectively receive the clock signal $clk_N$, $clk_1$, $clk_2$, ..., $clk_{(N-1)}$. Deduced by analogy, the clock input terminals $CK_1$-$CK_N$ of the SCN 220_(N-1) respectively receive the clock signal $clk_3$, $clk_4$, ..., $clk_N$, $clk_1$, $clk_2$, and the clock input terminals $CK_1$-$CK_N$ of the SCN 220_N respectively receive the clock signal $clk_2$, $clk_3$, ..., $clk_N$, $clk_1$.

Figure 3:
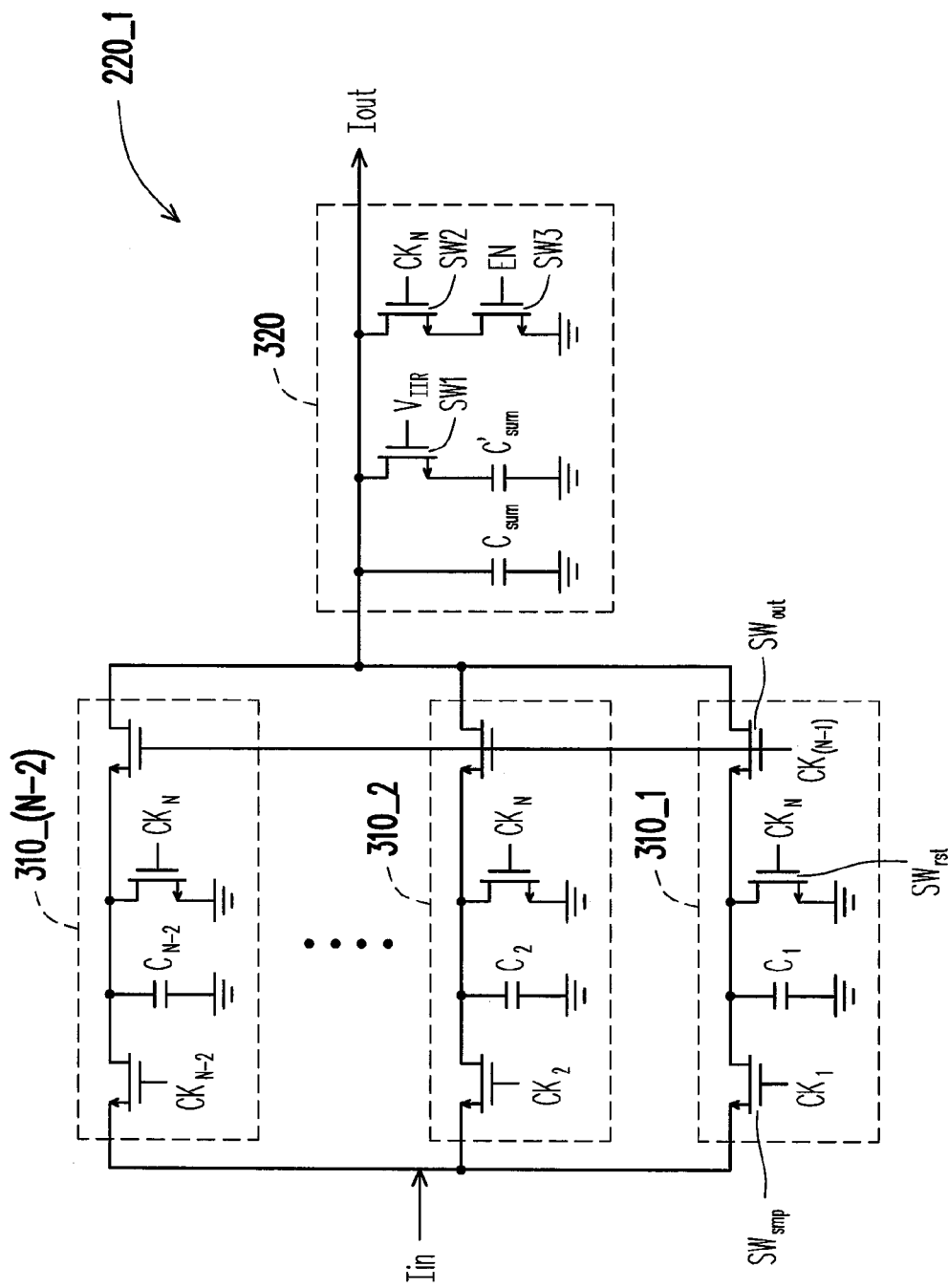
FIG. 3 is a circuit schematic diagram of a switched-capacitor network of FIG. 2 according to an embodiment of the disclosure.

The SCNs 220_1-220_N can be implemented by any means. For example, FIG. 3 is a circuit schematic diagram of the SCN 220_1 of FIG. 2 according to an embodiment of the disclosure. Implementations of the other SCNs 220_2-220_N can refer to related descriptions of the SCN 220_1. The SCN 220_1 includes a plurality of sampling units 310_1, 310_2, ..., 310_(N-2) and a summation unit 320. Sampling terminals of the sampling units 310_1-310_(N-2) are connected to an input terminal Iin of the SCN 220_1. The sampling units 310_1-310_(N-2) respectively sample the input terminal Iin of the SCN 220_1 with different phases. An input terminal of the summation unit 320 is connected to output terminals of the sampling units 310_1-310_(N-2) for summing sampling results of the sampling units 310_1-310_(N−2), and outputs a summation result to an output terminal Iout of the SCN 220_1.

Implementation of the sampling unit 310_1 is described blow, and implementations of the other sampling units 310_2-310_(N−2) can refer to related descriptions of the sampling unit 310_1 and the disclosure of FIG. 3. The sampling unit 310_1 includes a sampling switch SWsmp, a sampling capacitor $C_1$, a reset switch SWrst and an output switch SWout. A control terminal of the sampling switch SWsmp is connected to the clock input terminal $CK_1$ of the SCN 220_1. A first terminal of the sampling switch SWsmp serves as an input terminal of the sampling unit 310_1 for connecting the input terminal Iin of the SCN 220_1. A first terminal of the sampling capacitor $C_1$ is connected to a second terminal of the sampling switch SWsmp. A first terminal of the reset switch SWrst is connected to the first terminal of the sampling capacitor $C_1$. A second terminal of the reset switch SWrst and a second terminal of the sampling capacitor $C_1$ are connected to a reference voltage (for example, a ground voltage). A control terminal of the reset switch SWrst is connected to the clock input terminal $CK_N$ of the SCN 220_1. A control terminal of the output switch SWout is connected to the clock input terminal $CK_{(N-1)}$ of the SCN 220_1. A first terminal of the output switch SWout is connected to the first terminal of the sampling capacitor $C_1$, and a second terminal of the output switch SWout serves as an output terminal of the sampling unit 310_1 for connecting the input terminal of the summation unit 320.

Figure 4:
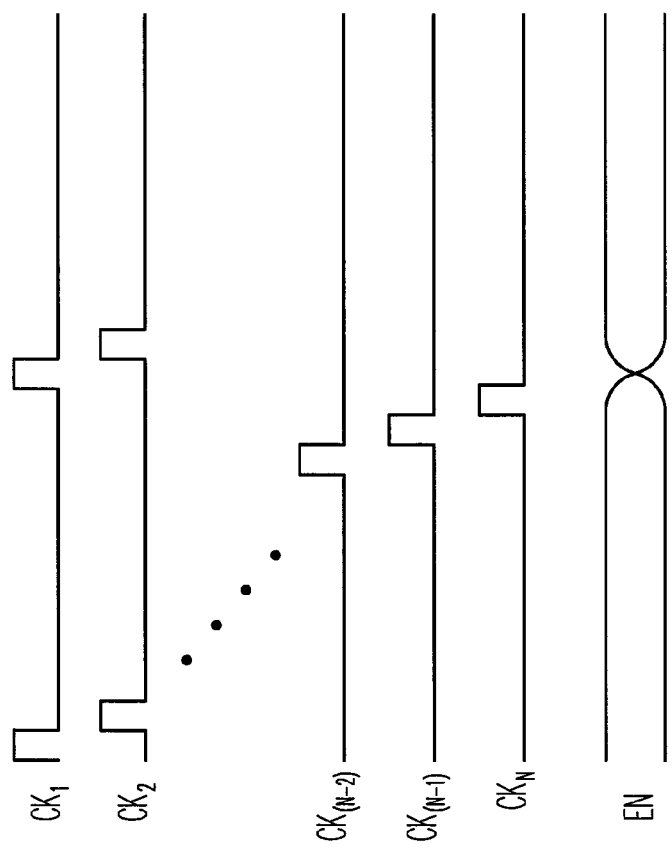
FIG. 4 is a timing schematic diagram of signals at clock input terminals $CK_1$-$CK_N$ of FIG. 3 and an enable signal EN according to an embodiment of the disclosure.

The control terminals of the sampling switches of the sampling units 310_2-310_(N−2) are respectively connected to the clock input terminals $CK_2$-$CK_{(N+2)}$ of the SCN 220_1. FIG. 4 is a timing schematic diagram of signals at clock input terminals $CK_1$-$CK_N$ of FIG. 3 and an enable signal EN according to an embodiment of the disclosure. Referring to FIG. 3 and FIG. 4, the sampling units 310_1-310_(N−2) sequentially samples the input terminal En of the SCN 220_1, and stores sampling results at the sampling capacitors $C_1$, $C_2$, ..., $C_{N-2}$. After the sampling units 310_1-310_(N−2) completes the sampling operations, a clock signal of the clock input terminal $CK_{(N-1)}$ triggers the sampling units 310_1-310_(N−2) to output the respective sampling results to the summation unit 320. After the sampling units 310_1-310_(N−2) output the respective sampling results to the summation unit 320, the signal of the clock input terminal $CK_N$ triggers the sampling units 310_1-310_(N−2) to reset the respective sampling results to an initial value (for example, 0 volt).

As shown in FIG. 3, the summation unit 320 includes a summation capacitor $C_{sum}$, a switch SW1, a capacitor $C'_{sum}$, a switch SW2 and a switch SW3. A first terminal of the summation capacitor $C_{sum}$ is connected to the output terminals of the sampling units 310_1-310_(N−2). When the output switches of the sampling units 310_1-310_(N−2) are turned on, the summation capacitor $C_{sum}$ sums the sampling results of the sampling units 310_1-310_(N−2).

A first terminal of the switch SW1 is connected to the output terminals of the sampling units 310_1-310_(N−2), and a control terminal of the switch SW1 is controlled by a control signal $V_{IIR}$. A first terminal of the capacitor $C'_{sum}$ is connected to a second terminal of the switch SW1, and a second terminal of the capacitor $C'_{sum}$ is connected to the reference voltage (for example, the ground voltage). The switch SW1 is turned on/off in response to the control signal $V_{IIR}$, so as to change an equivalent capacitance of the summation capacitor $C_{sum}$. As the equivalent capacitance of the summation capacitor $C_{sum}$ is changed, a required bandwidth is changed. Therefore, the switch SW1 and the capacitor $C'_{sum}$ are also referred to as a bandwidth programming circuit.

A first terminal of the switch SW2 is connected to the first terminal of the summation capacitor $C_{sum}$, and a control terminal of the switch SW2 is connected to the clock input terminal $CK_N$ of the SCN 220_1. A first terminal of the switch SW3 is connected to a second terminal of the switch SW2. A second terminal of the switch SW3 is connected to the reference voltage (for example, the ground voltage). A control terminal of the switch SW3 is controlled by the enable signal EN. The SCN 220_1 can be programmed as an infinite impulse response (IIR) filter or a finite impulse response (FIR) filter in response to the enable signal EN. If the enable signal EN has a low level in case of a narrow band, a reset operation of the switch SW2 performed on the summation capacitor $C_{sum}$ is disabled, so that before a next summation period, charges are maintained in the summation capacitor $C_{sum}$ and/or the capacitor $C'_{sum}$. Namely, when the enable signal EN has the low level, the SCN 220_1 is regarded as an IIR filter, and a transfer function of the IIR filter in a z domain is as follows:

$$H_{IIR}(z) = \frac{\left(\dfrac{\sum_{i=1}^{N-2} C_{(N-1-i)} z^{-(i-1)}}{C_{sum} + \sum_{i=1}^{N-2} C_i}\right)}{\left(1 - \dfrac{C_{sum} z^{-(N-1)}}{C_{sum} + \sum_{i=1}^{N-2} C_i}\right)} \quad (1)$$

If the enable signal EN has a high level in case of a wide band, the reset operation of the switch SW2 performed on the summation capacitor $C_{sum}$ is enabled, so that before the next summation period, the charges of the summation capacitor $C_{sum}$ and/or the capacitor $C'_{sum}$ are abandoned. Namely, when the enable signal EN has the high level, the SCN 220_1 is regarded as a FIR filter, and a transfer function of the FIR filter in the z domain is as follows:

$$H_{IIR}(z) = \left(\dfrac{\sum_{i=1}^{N-2} C_{(N-1-i)} z^{-(i-1)}}{C_{sum} + \sum_{i=1}^{N-2} C_i}\right) \quad (2)$$

Therefore, the switch SW2 and the switch SW3 can be referred to as a FIR/IIR filter selection circuit. Moreover, according to the function (1), the control signal $V_{IIR}$ controls a resistance of the switch SW1 to change the charges stored in the capacitor $C'_{sum}$, so as to effectively change the equivalent capacitance of the summation capacitor $C_{sum}$, and accordingly modulate a frequency response of the IIR filter. According to the function (1) and the function (2), a signal bandwidth is programmable. The FIR/IIR filter selection circuit (i.e. the switches SW2 and SW3) and/or the bandwidth programming circuit (i.e. the switch SW1 and the capacitor $C'_{sum}$) can be omitted according to an actual design requirement. A filtered output signal (a signal at the output terminal Iout of the SCN 220_1) is down-converted to a baseband.

Figure 5:
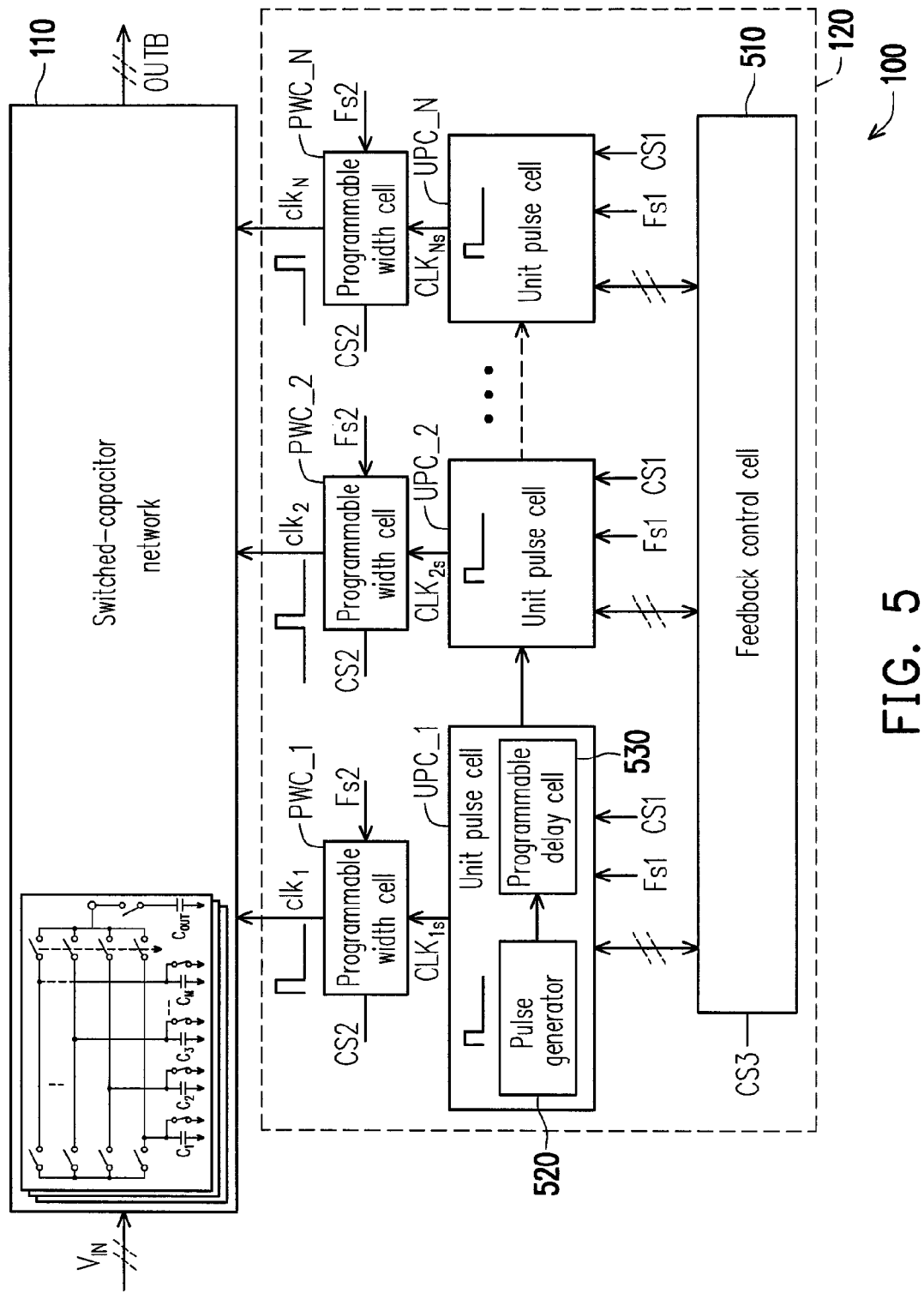
FIG. 5 is a circuit block schematic diagram of a clock generator of FIG. 1 according to an embodiment of the disclosure.

FIG. 5 is a circuit block schematic diagram of the clock generator 120 of FIG. 1 according to an embodiment of the disclosure. The clock generator 120 adjusts phase differences of the clock signals $clk_1$-$clk_N$ according to a first control signal CS1, and adjusts pulse widths of the clock signals $clk_1$-$clk_N$ according to a second control signal CS2. By adjusting the phase differences of the clock signals $clk_1$-$clk_N$, pulses of the clock signals $clk_1$-$clk_N$ are not overlapped to each other in time. The CDF 100 can compensate a DC offset and a gain variation when requiring different bandwidths.

In the present embodiment, the clock generator 120 includes N unit pulse cells UPC_1-UPC_N, N programmable width cells PWC_1-PWC_N and a feedback control cell (FCC) 510. The FCC 510 is coupled to the unit pulse cells UPC_1-UPC_N. The FCC 510 provides different feedback paths between the unit pulse cells UPC_1-UPC_N according to a third control signal CS3. For example, the FCC 510 provides a feedback path between the unit pulse cell UPC_1 and the unit pulse cell UPC_N according to the third control signal CS3. The FCC 510 controls the feedback path to select a required cock period and a specific output sampling rate.

The unit pulse cells UPC_1_UPC_N can provide a default pulse width and a specific delay to the programmable width cells PWC_1-PWC_N and the unit pulse cell of a next stage. The unit pulse cells UPC_1_UPC_N are connected in series, where an $i^{th}$ unit pulse cell UPC_i samples an $(i-1)^{th}$ delay clock output by an $(i-1)^{th}$ unit pulse cell UPC_(i-1) according to a first frequency Fs1, so as to obtain an $i^{th}$ pulse signal $CLK_{is}$. Alternatively, the $i^{th}$ unit pulse cell UPC_i samples a delay clock come from the feedback path of the FCC 510 to obtain the $i^{th}$ pulse signal $CLK_{is}$. The $i^{th}$ unit pulse cell UPC_i delays the $i^{th}$ pulse signal $CLK_{is}$ according to the first control signal CS1 to obtain an $i^{th}$ delay clock, and outputs the $i^{th}$ delay clock to an $(i+1)^{th}$ unit pulse cell UPC_(i+1), or outputs the $i^{th}$ delay clock to the feedback path of the FCC 510.

An $i^{th}$ programmable width cell PWC_i in the programmable width cells PWC_1-PWC_N is coupled to the $i^{th}$ unit pulse cell UPC_i for receiving the $i^{th}$ pulse signal $CLK_{is}$. For example, the first programmable width cell PWC_1 is coupled to the first unit pulse cell UPC_1 for receiving the first pulse signal $CLK_{1s}$. The $i^{th}$ programmable width cell PWC_i adjusts a pulse width of the $i^{th}$ pulse signal $CLK_{is}$ according to the second control signal CS2, so as to obtain the $i^{th}$ clock signal $clk_i$ of the clock signals $clk_1$-$clk_N$. The $i^{th}$ programmable width cell PWC_i outputs the $i^{th}$ clock signal $clk_i$ to the SCN 110.

Figure 6:
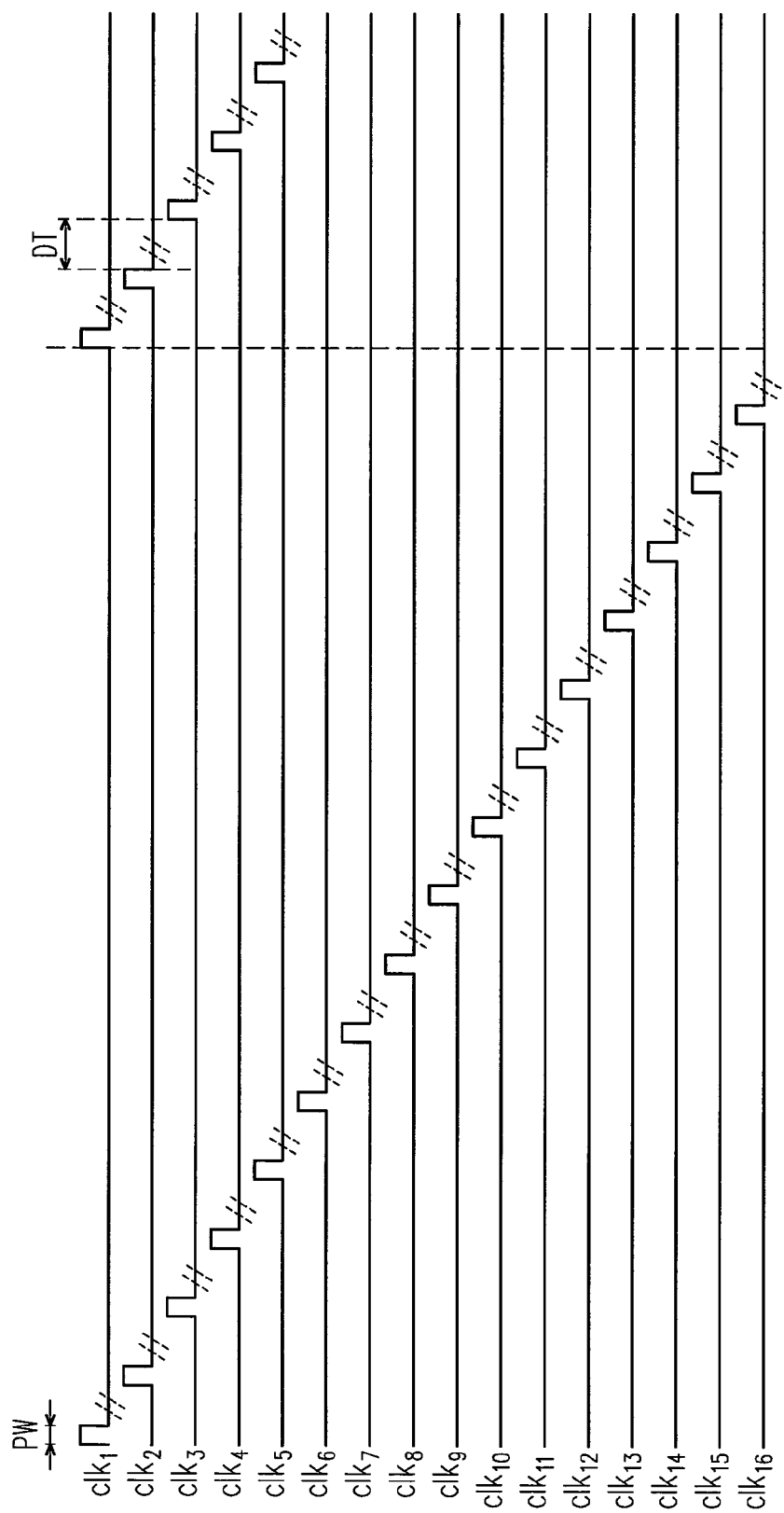
FIG. 6 is a waveform timing schematic diagram of clock signals $clk_1$-$clk_N$ of FIG. 5 in case that a tap-length N is 16 according to an embodiment of the disclosure.

FIG. 6 is a waveform timing schematic diagram of the clock signals $clk_1$-$clk_N$ of FIG. 5 in case that the tap-length N is 16 according to an embodiment of the disclosure. In the embodiment of FIG. 6, it is assumed that a default pulse width PW of the clock signals $clk_1$-$clk_{16}$ is about 1/Fs1. The default pulse width PW is determined according to an actual design requirement. In case that the default pulse width PW of the clock signals $clk_1$-$clk_{16}$ of the SCN 110 is not changed, the unit pulse cells UPC_1-UPC_16 adjust the phase differences of the clock signals $clk_1$-$clk_{16}$ according to the first control signal CS1, for example, adjust a delay time DT of the clock signals. Therefore, the CDF 100 can adjust an output bandwidth according to the first control signal CS1. Since the default pulse width PW of the clock signals $clk_1$-$clk_{16}$ is not changed, a gain and a DC level of the CDF 100 are also not changed. By controlling the delay of the pulse signals output by the unit pulse cells UPC_1-UPC_16, the CDF 100 can provide a variable bandwidth, a constant gain and a stable DC level.

However, a process variation may offset the gain and the DC level of the CDF 100. Referring to FIG. 5 and FIG. 6, regarding the process variation of the CDF 100, the programmable width cells PWC_1-PWC_N can adjust the pulse width PW of the clock signals $clk_1$-$clk_N$ of the SCN 110 according to the second control signal CS2, so as to compensate a gain variation caused by the process variation, so that the CDF 100 can provide the constant gain and the stable DC level. When the process variation causes a gain loss of the CDF 100, the programmable width cells PWC_1-PWC_N select a wide pulse option to compensate the gain loss. Comparatively, the programmable width cells PWC_1-PWC_N select a narrow pulse option to compensate a gain boost of the CDF 100.

Due to the process variation of the CDF 100, when different bandwidths are provided, the programmable width cells PWC_1-PWC_N fix the required DC level. The programmable width cells PWC_1-PWC_N of the CDF 100 may provide a wide pulse to ameliorate the gain loss of the CDF 100, and support a narrow pulse as that of the DC level to improve the gain of the CDF. Accordingly, with reference of the required bandwidth, the gain and the DC level, the system may correspondingly provide the specific control signals CS1, CS2 and CS3 to the unit pulse cells UPC_1-UPC_N, the FCC 510 and the programmable width cells PWC_1-PWC_N, so as to achieve a gain and DC level offset calibration function of the CDF 100.

FIG. 5 illustrates an implementation of the first unit pulse cell UPC_1, and implementations of the other unit pulse cells UPC_2-UPC_N can be deduced according to related descriptions of the unit pulse cell UPC_1, or the other unit pulse cells can be implemented through a same principle, which is not limited by the disclosure. The first unit pulse cell UPC_1 includes a pulse generator 520 and a programmable delay cell (PDC) 530. The pulse generator 520 samples a delay clock output by the previous unit pulse cell according to the first frequency Fs1, so as to output the first pulse signal $CLK_{1s}$ to the first programmable width cell PWC_1. For example, the pulse generator 520 samples an $N^{th}$ delay clock output by the unit pulse cell UPC_N through the feedback path of the FCC 510, so as to output the first pulse signal $CLK_{1s}$ to the first programmable width cell PWC_1. The PDC 530 is coupled to the pulse generator 520 for receiving the first pulse signal $CLK_{1s}$. The PDC 530 delays the first pulse signal $CLK_{1s}$ according to the first control signal CS1 to obtain the first delay clock, and outputs the first delay clock to a next unit pulse cell, for example, the unit pulse cell UPC_2. The PDC 530 can be implemented by a D-type flip-flop string, an inverter chain, a voltage-controlled delay line (VCDL), etc., though the disclosure is not limited thereto. In order to maintain the constant gain and the stable DC level under different bandwidths, the PDC 530 prolongs the delay clock transmitted from the pulse generator 520 to the next unit pulse cell UPC_2. The delay time is inversely proportional to the bandwidth, which represents that a long pulse delay helps the CDF 100 providing a high frequency-dividing rate. By providing a suitable clock cycle to the CDF 100, the CDF 100 may have the constant gain and the stable DC level. By controlling the delay of the pulse signals come from the unit pulse cells UPC_1-UPC_N, the CDF 100 can simultaneously provide the variable bandwidth, the constant gain and the stable DC level.

Figure 7:
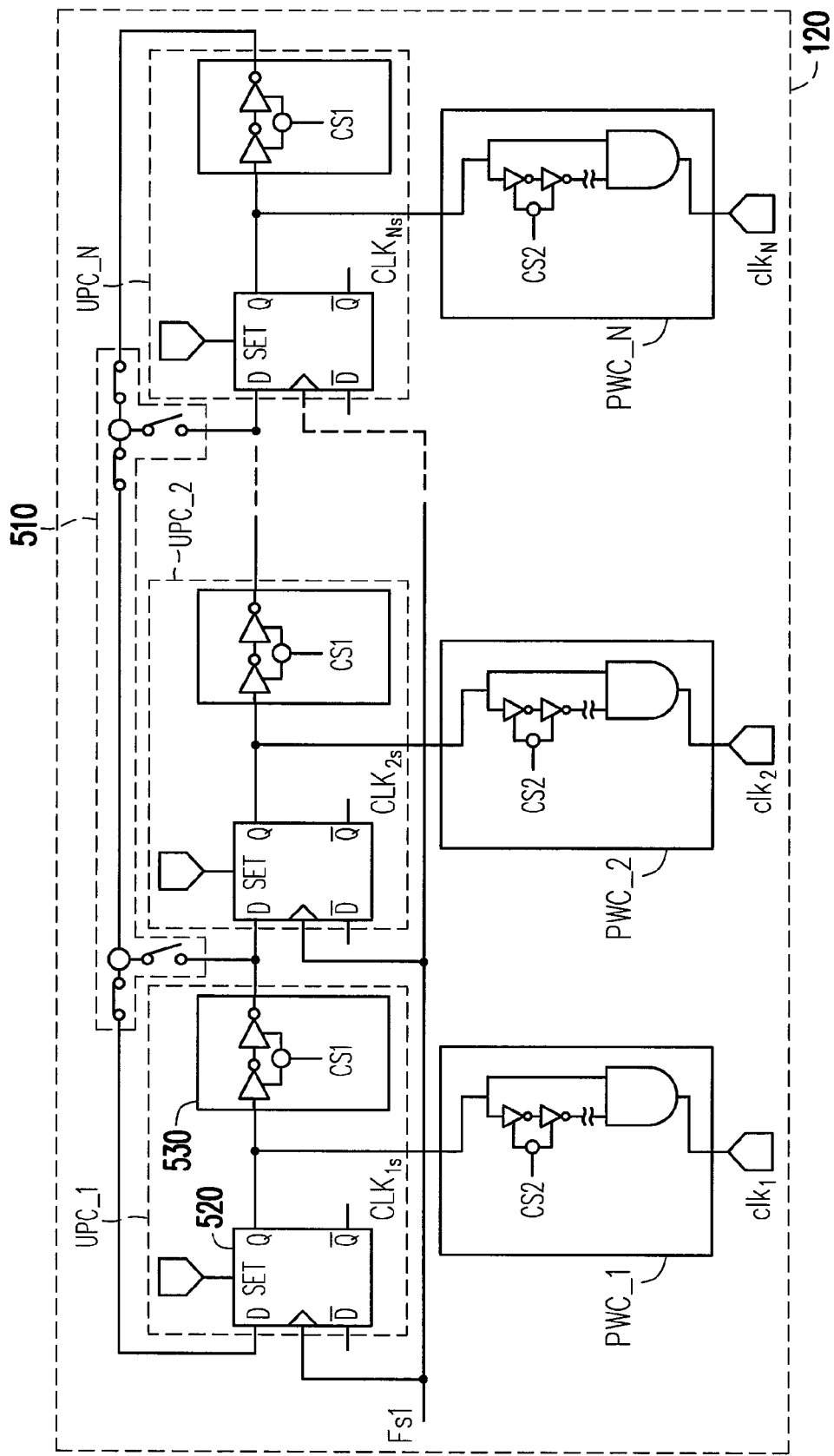
FIG. 7 is a circuit block schematic diagram of a clock generator of FIG. 5 according to an embodiment of the disclosure.

FIG. 7 is a circuit block schematic diagram of the clock generator 120 of FIG. 5 according to an embodiment of the disclosure. In the present embodiment, the FCC 510 includes a plurality of feedback switches, as that shown in FIG. 7. Operations of the feedback switches are controlled by the third control signal CS3. The feedback switches determine the feedback path, which, for example, provides the feedback path between the input terminal of the unit pulse cell UPC_1 and the output terminal of the unit pulse cell UPC_N, as that shown in FIG. 7.

In the embodiment of FIG. 7, the pulse generator 520 includes a flip-flop. A trigger terminal of the flip-flop receives the first frequency Fs1, an input terminal of the flip-flop is coupled to the output terminal of the previous unit pulse cell, and an output terminal of the flip-flop is coupled to the input terminal of the PDC 530. A system controller can transmit an initial value to a setting terminal SET of the pulse generator 520 of each of the unit pulse cells UPC_1-UPC_N, so as to set initial states of the pulse signals $CLK_{1s}$-$CLK_{Ns}$.

The PDC 530 includes a delay line, and FIG. 7 illustrates two NOT gates to represent the delay line. An input terminal of the delay line receives the pulse signal $CLK_{1s}$ output by the pulse generator 520. An output terminal of the delay line outputs the delay clock to the next unit pulse cell UPC_2. Although two NOT gates are illustrated in FIG. 7 to represent the delay line, an actual implementation of the delay line is not limited thereto. The first control signal CS1 determines/controls a delay time of the delay line, so that the first control signal CS1 can be used to adjust the delay time DT of FIG. 6.

Referring to FIG. 7, in the present embodiment, the programmable width cells PWC_1-PWC_N respectively include a delay line and an AND gate. Taking an $i^{th}$ programmable width cell PWC_i as an example, an input terminal of the delay line thereof is coupled to the $i^{th}$ unit pulse cell UPC_i for receiving the $i^{th}$ pulse signal $CLK_{is}$, where a delay time of the delay line is controlled by the second control signal CS2. A first input terminal of the AND gate is coupled to the $i^{th}$ unit pulse cell UPC_i for receiving the $i^{th}$ pulse signal $CLK_{is}$. A second input terminal of the AND gate is coupled to an output terminal of the delay line. An output terminal of the AND gate outputs the $i^{th}$ clock signal $clk_i$ to the SCN 110.

Figure 8:
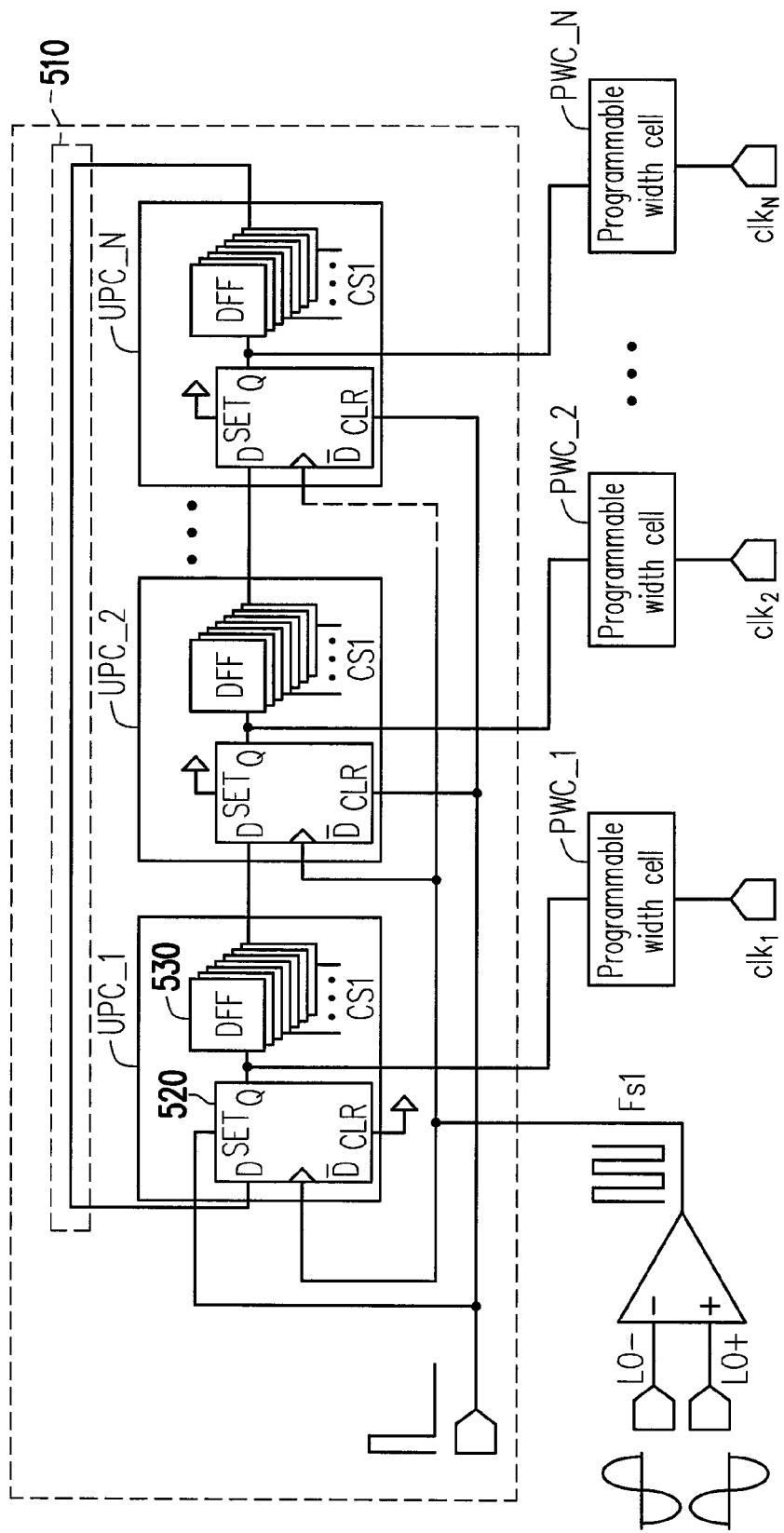
FIG. 8 is a circuit block schematic diagram of a clock generator of FIG. 5 according to an embodiment of the disclosure.

FIG. 8 is a circuit block schematic diagram of the clock generator of FIG. 5 according to an embodiment of the disclosure. Descriptions of the embodiment of FIG. 8 can refer to the related descriptions of FIG. 5, FIG. 6 and FIG. 7, and different to the embodiment of FIG. 7, in the embodiment of FIG. 8, a flip-flop string is used to implement the PDC 530.

Figure 9:
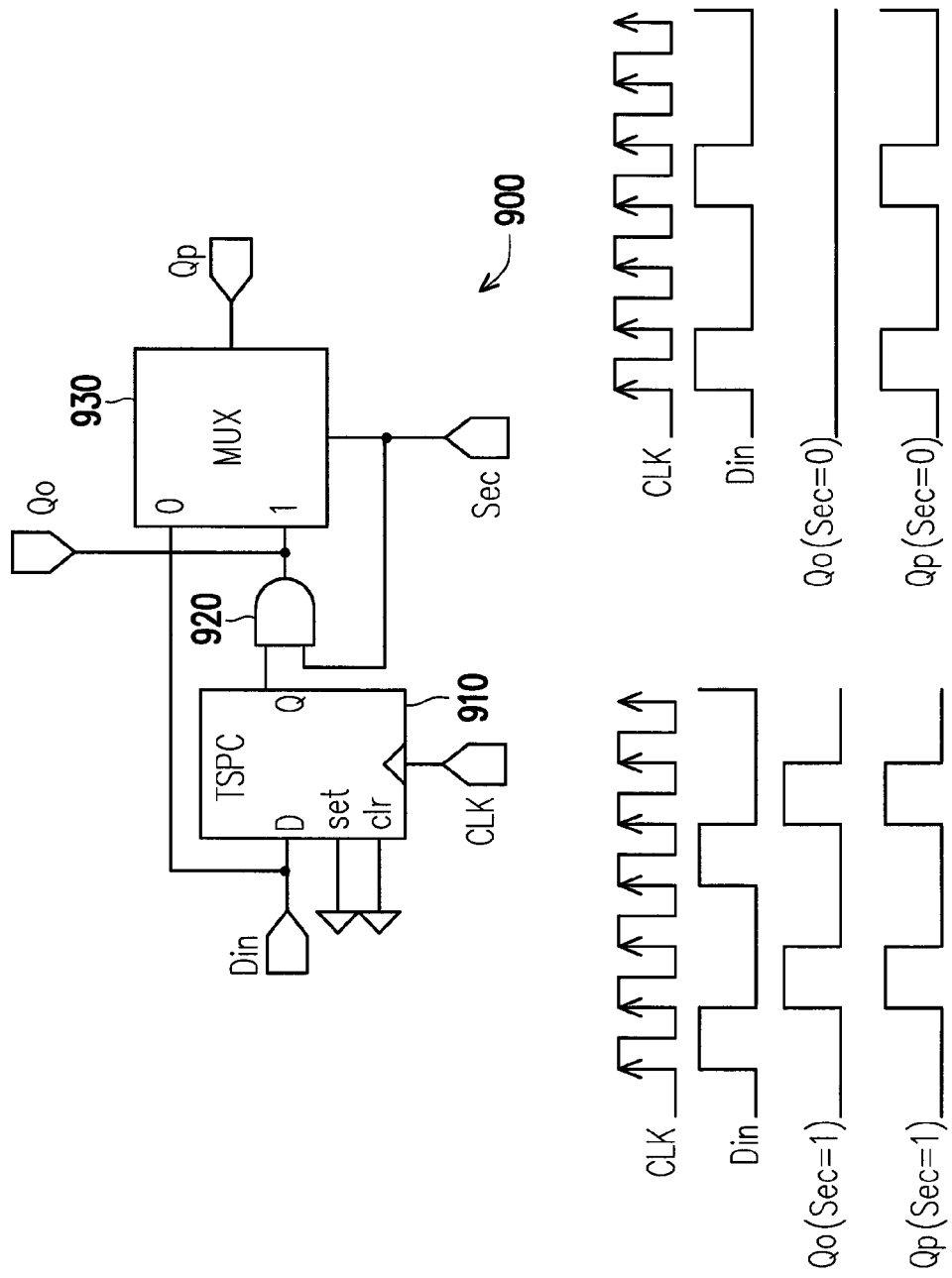
FIG. 9 is a circuit block schematic diagram of a singe flip-flop in a flip-flop string of FIG. 8 according to an embodiment of the disclosure.

FIG. 9 is a circuit block schematic diagram of a singe flip-flop 900 in the flip-flop string of FIG. 8 according to an embodiment of the disclosure. The flip-flop 900 of the flip-flop string includes a true single-phase clocking (TSPC) flip-flop 910, an AND gate 920 and a multiplexer 930. An input terminal of the TSPC flip-flop 910 serves as an input terminal Din of the flip-flop 900. A trigger terminal of the TSPC flip-flop 910 receives a trigger clock CLK. A first input terminal of the AND gate 920 is coupled to an output terminal of the TSPC flip-flop 910. A second input terminal of the AND gate 920 receives a selection signal Sec. A control terminal of the multiplexer 930 receives the selection signal Sec. A first input terminal of the multiplexer 930 is coupled to the input terminal of the TSPC flip-flop 910. A second input terminal of the multiplexer 930 is coupled to an output terminal of the AND gate 920. An output terminal of the multiplexer 930 serves as a first output terminal Qp of the flip-flop 900 for connecting an input terminal of a next-stage flip-flop in the flip-flop string. The output terminal of the AND gate 920 serves as a second output terminal Qo of the flip-flop 900.

Figure 10:
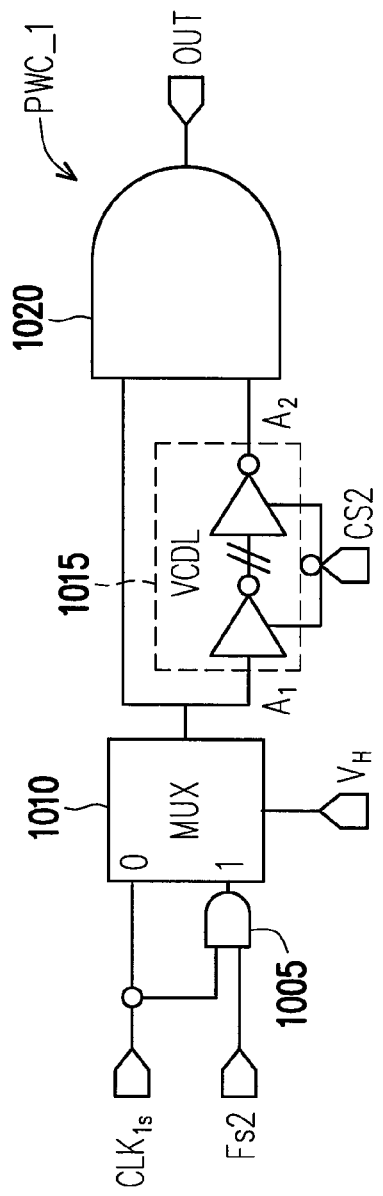
FIG. 10 is a circuit block schematic diagram of a programmable width cell of FIG. 5 according to an embodiment of the disclosure.

FIG. 10 is a circuit block schematic diagram of a programmable width cell PWC_1 of FIG. 5 according to an embodiment of the disclosure. Implementations of the other programmable width cells PWC_2-PWC_N can refer to the related descriptions of the programmable width cell PWC_1. In the present embodiment, the programmable width cell PWC_1 includes an AND gate 1005, a multiplexer 1010, a voltage-controlled delay line (VCDL) 1015 and an AND gate 1020. A first input terminal of the AND gate 1005 is coupled to the pulse generator 520 for receiving the pulse signal $CLK_{1s}$. A second input terminal of the AND gate 1005 receives a second frequency Fs2. In other embodiments, the second input terminal of the AND gate 1005 receives other clock signals different to a pulse width of the second frequency Fs2. A control terminal of the multiplexer 1010 receives a control signal $V_H$. A first input terminal of the multiplexer 1010 is coupled to the pulse generator 520 for receiving the pulse signal $CLK_{1s}$. A second input terminal of the multiplexer 1010 is coupled to an output terminal of the AND gate 1005. A control terminal of the VCDL 1015 receives the control signal CS2. An input terminal of the VCDL 1015 is coupled to an output terminal of the multiplexer 1010. A first input terminal of the AND gate 1020 is coupled to an output terminal of the multiplexer 1010. A second input terminal of the AND gate 1020 is coupled to an output terminal of the VCDL 1015. An output terminal OUT of the AND gate 1020 serves as an output terminal of the programmable width cell PWC_1 to output different pulse widths to the SCN 110.

Figure 11:
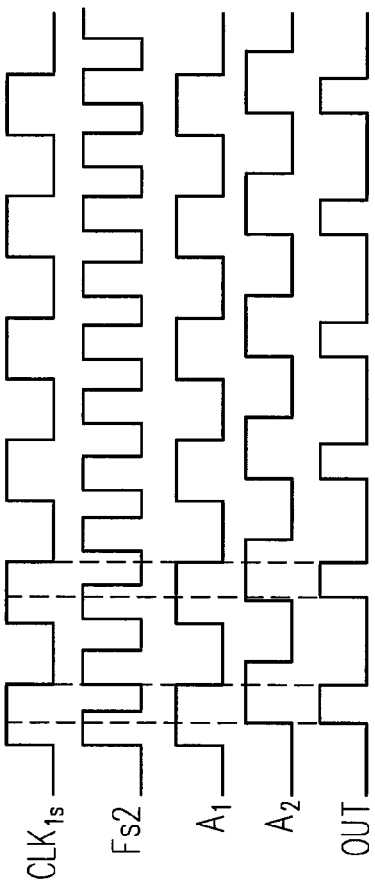
FIG. 11 and FIG. 12 are signal waveform schematic diagrams of a programmable width cell of FIG. 10 according to an embodiment of the disclosure.
Figure 12:
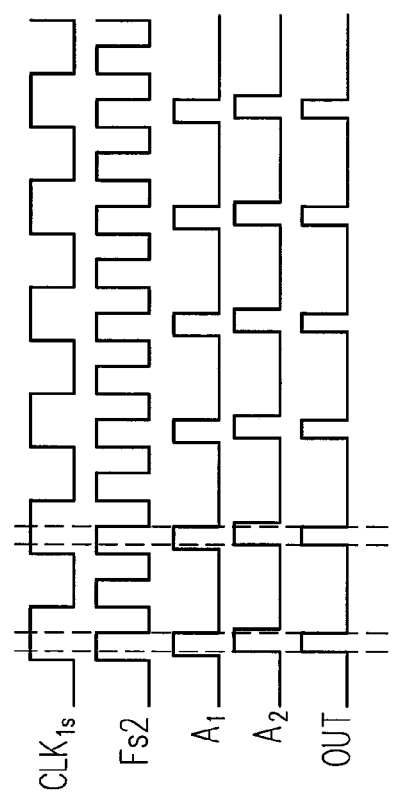

FIG. 11 and FIG. 12 are signal waveform schematic diagrams of the programmable width cell PWC_1 of FIG. 10 according to an embodiment of the disclosure. When the control signal $V_H$ is logic 0, the pulse width generated by the programmable width cell PWC_1 can be greater than 0.5/Fs2, as that shown in FIG. 11. When the control signal $V_H$ is logic 1, the pulse width generated by the programmable width cell PWC_1 can be smaller than 0.5/Fs2, as that shown in FIG. 12.

However, implementation of the clock generator 120 of FIG. 1 should not be limited to the embodiment in FIG. 5. For example, in other embodiments, the clock generator 120 of FIG. 1 comprises a first clock generator illustrated in FIG. 13 or a second clock generator illustrated in FIG. 14 or other clock generator circuit.

Figure 13:
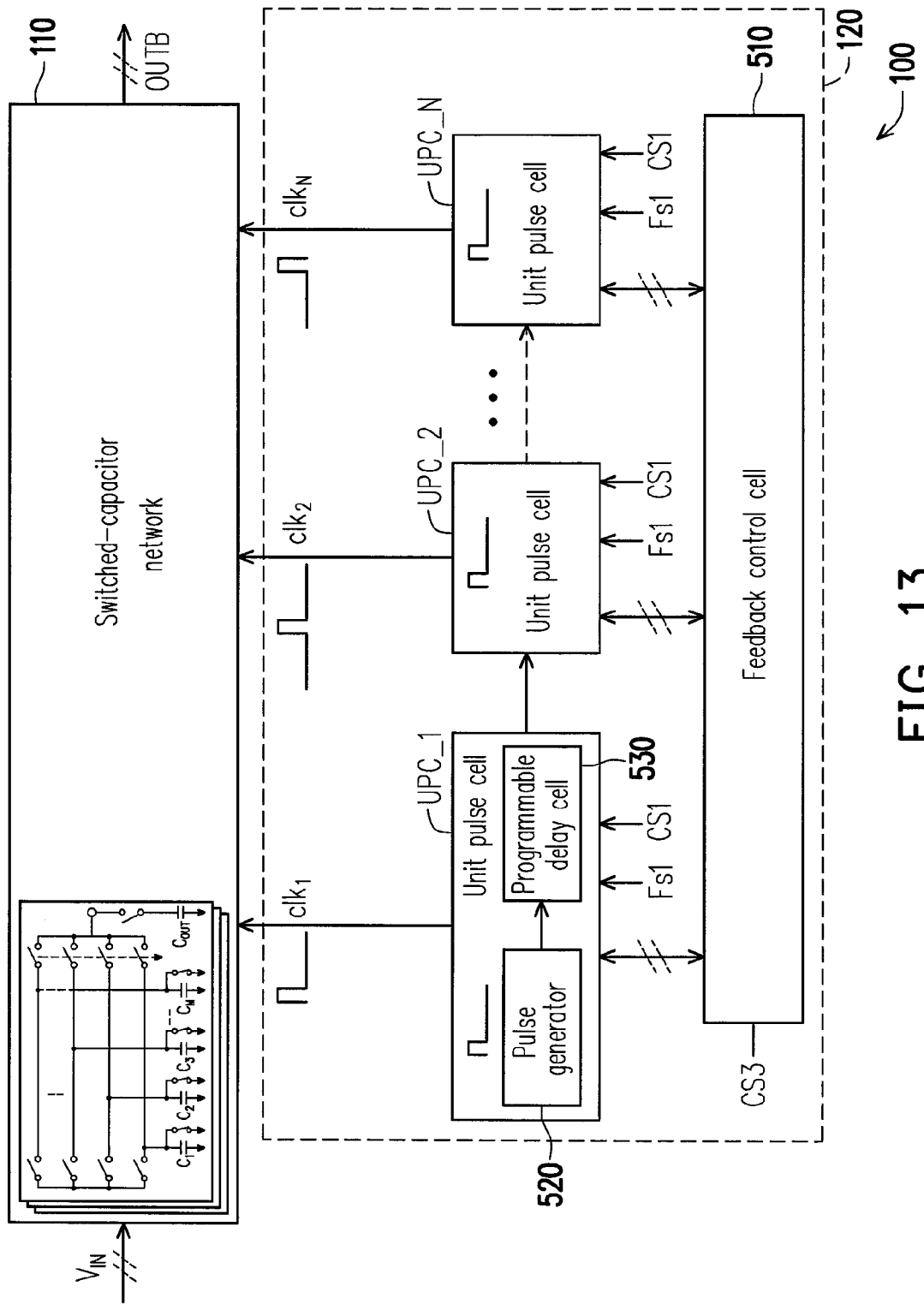
FIG. 13 is a circuit block schematic diagram of a clock generator of FIG. 1 according to an embodiment of the disclosure.

FIG. 13 is a circuit block schematic diagram of the first clock generator in the clock generator 120 of FIG. 1 according to another embodiment of the disclosure. The entirety of each of the above-mentioned embodiments of FIGS. 1-12 is hereby incorporated by reference herein and made a part of this embodiment of FIG. 13. The embodiment of FIG. 13 is similar to the embodiment of FIG. 5, and a difference there between is that the programmable width cells PWC_1-PWC_N are omitted in the embodiment of FIG. 13. The clock generator 120 includes N unit pulse cells UPC_1-UPC_N and the FCC 510. The unit pulse cells UPC_1-UPC_N are connected in series, where the $i^{th}$ unit pulse cell UPC_i samples a delay clock of the previous unit pulse cell (for example, the $(i-1)^{th}$ delay clock output by the $(i-1)^{th}$ unit pulse cell UPC_(i-1)) according to the first frequency Fs1, so as to obtain the $i^{th}$ clock signal $clk_i$ of the clock signals $clk_1$-$clk_N$. The $i^{th}$ unit pulse cell UPC_i outputs the $i^{th}$ clock signal $clk_i$ to the SCN 110. Moreover, the $i^{th}$ unit pulse cell UPC_i delays the $i^{th}$ clock signal $clk_i$ according to the first control signal CS1 to obtain the $i^{th}$ delay clock, and outputs the $i^{th}$ delay clock to a next unit pulse cell, for example, the $(i+1)^{th}$ unit pulse cell UPC_(i+1).

In some cases, the process variation is probably tolerable (or is neglected). In case that the gain variation caused by the process variation is tolerable, the programmable width cells PWC_1-PWC_N can be omitted without compensating the pulse widths of the clock signals $clk_1$-$clk_N$. Alternatively, in other embodiments, in case that the gain variation caused by the process variation is required to be compensated, the task of adjusting the pulse widths of the clock signals $clk_1$-$clk_N$ can be implemented by the unit pulse cells UPC_1-UPC_N in collaboration with the first frequency Fs1, which is, for example, implemented by using the PDC 530 of FIG. 7 and changing the first frequency Fs1.

Figure 14:
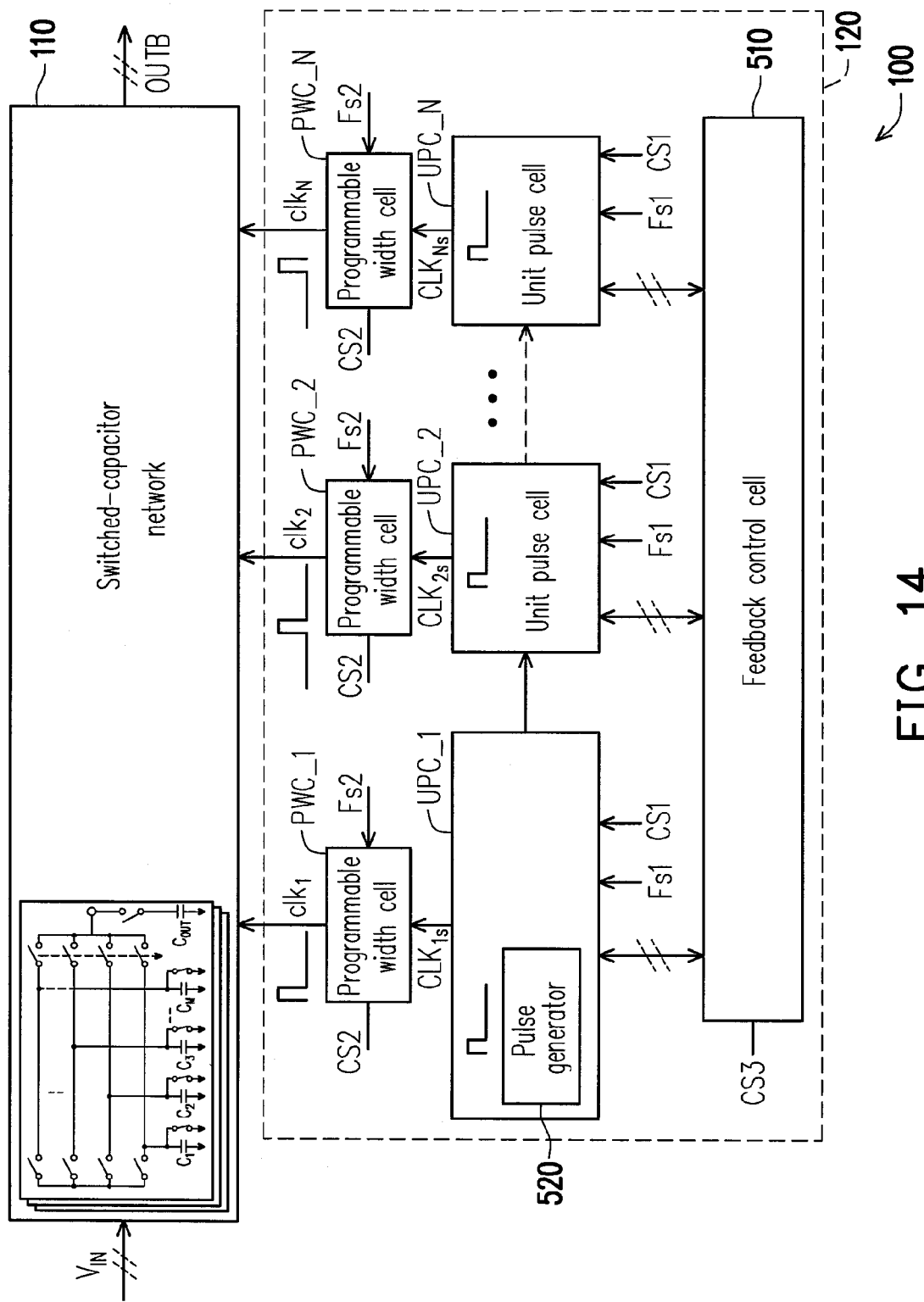
FIG. 14 is a circuit block schematic diagram of a clock generator of FIG. 1 according to an embodiment of the disclosure.

FIG. 14 is a circuit block schematic diagram of the second clock generator in the clock generator 120 of FIG. 1 according to an embodiment of the disclosure. The entirety of each of the above-mentioned embodiments of FIGS. 1-12 is hereby incorporated by reference herein and made a part of this embodiment of FIG. 14. The clock generator 120 is coupled to the SCN 110 for providing the clock signals $clk_1$-$clk_N$, where pulses of the clock signals $clk_1$-$clk_N$ are adjacent to each other in time, as that shown in FIG. 4. The clock generator 120 adjusts the pulse widths of the clock signals $clk_1$-$clk_N$ according to the control signal CS2.

The clock generator 120 includes N unit pulse cells UPC_1-UPC_N, N programmable width cells PWC_1-PWC_N and the FCC 510. The unit pulse cells UPC_1_UPC_N are connected in series, where the $i^{th}$ unit pulse cell UPC_i samples the $(i-1)^{th}$ pulse signal $CLK_{(i-1)s}$ output by the $(i-1)^{th}$ unit pulse cell UPC_(i-1) according to the first frequency Fs1, so as to obtain the $i^{th}$ pulse signal $CLK_{is}$. The $i^{th}$ unit pulse cell UPC_i outputs the $i^{th}$ pulse signal $CLK_{is}$ to the $(i+1)^{th}$ unit pulse cell UPC_(i+1). An $i^{th}$ programmable width cell PWC_i in the programmable width cells PWC_1-PWC_N is coupled to the $i^{th}$ unit pulse cell UPC_i for receiving the $i^{th}$ pulse signal $CLK_{is}$. For example, the first programmable width cell PWC_1 is coupled to the first unit pulse cell UPC_1 for receiving the first pulse signal $CLK_{1s}$. The $i^{th}$ programmable width cell PWC_i adjusts a pulse width of the $i^{th}$ pulse signal $CLK_{is}$ according to the second control signal CS2, so as to obtain the $i^{th}$ clock signal $clk_i$ of the clock signals $clk_1$-$clk_N$. The $i^{th}$ programmable width cell PWC_i outputs the $i^{th}$ clock signal $clk_i$ to the SCN 110.

The embodiment of FIG. 14 is similar to the embodiment of FIG. 5 and a difference there between is that in the embodiment of FIG. 14, the unit pulse cells UPC_1-UPC_N respectively omit the PDC 530. In the $i^{th}$ unit pulse cell UPC_i, the pulse generator 520 samples the $(i-1)^{th}$ pulse signal $CLK_{(i-1)s}$ output by the previous unit pulse cell UPC_(i-1) according to the first frequency Fs1, so as to output the $i^{th}$ pulse signal $CLK_{is}$ to the next unit pulse cell UPC_(i+1) and the $i^{th}$ programmable width cell PWC_i. In case of an application without dynamically changing the bandwidth, the unit pulse cells UPC_1-UPC_N are not required to adjust the phase differences of the clock signals $clk_1$-$clk_N$. Regarding the process variation of the CDF 100, the programmable width cells PWC_1-PWC_N can adjust the pulse widths of the clock signals $clk_1$-$clk_N$ of the SCN 110 according to the second control signal CS2, so as to compensate the gain variation caused by the process variation, so that the CDF 100 can provide the constant gain and the stable DC level.

The disclosure provides a charge-domain filtering method, which includes following steps. A SCN receives an input signal, and the input signal is sampled according to a plurality of clock signals, where the clock signals have different phases. Phase differences and pulse widths of the clock signals generated by a clock generator are adjusted according to at least one control signal.

By adjusting the phase differences of the clock signals, the pulses of the clock signals are not overlapped to each other in time. Moreover, the pulse widths of the clock signals can be adjusted, so that the pulses of the clock signals are adjacent to each other in time.

In summary, in some embodiments, the CDF 100 does not change the default pulse width of the clock signals $clk_1$-$clk_N$ of the SCN 110, but adjusts the phase differences of the clock signals $clk_1$-$clk_N$, so that the CDF 100 can provide the variable bandwidth, the constant gain and the stable DC level. Regarding the process variation of the CDF 100, in some other embodiments, the CDF 100 can adjust the pulse widths of the clock signals $clk_1$-$clk_N$ of the SCN 110 according to the control signal CS2, so as to compensate the gain variation caused by the process variation, so that the CDF 100 can provide the constant gain and the stable DC level.

It will be apparent to those skilled in the art that various modifications and variations can be made to the structure of the disclosure embodiments without departing from the scope or spirit of the disclosure. In view of the foregoing, it is intended that the disclosure cover modifications and variations of this disclosure provided they fall within the scope of the following claims and their equivalents.

What is claimed is:

1. A charge-domain filter, comprising:
   a switched-capacitor network, having an input terminal receiving an input signal, and the switched-capacitor network sampling the input signal according to a plurality of clock signals, wherein the clock signals have different phases; and
   a clock generator, coupled to the switched-capacitor network for providing the clock signals, wherein the clock generator adjusts phase differences of the clock signals according to a first control signal or adjusts pulse widths of the clock signals according to a second control signal, the clock generator comprises a first clock generator or a second clock generator;
   wherein the first clock generator comprises N unit pulse cells UPC_1-UPC_N connected in series, wherein in the first clock generator, an $i^{th}$ unit pulse cell UPC_i samples an $(i-1)^{th}$ delay clock output by an $(i-1)^{th}$ unit pulse cell UPC_(i-1) according to a first frequency, so as to obtain an $i^{th}$ clock signal $clk_i$ of the clock signals, the $i^{th}$ unit pulse cell UPC_i outputs the $i^{th}$ clock signal $clk_i$ to the switched-capacitor network, the $i^{th}$ unit pulse cell UPC_i delays the $i^{th}$ clock signal $clk_i$ according to the first control signal to obtain an $i^{th}$ delay clock, and the $i^{th}$ unit pulse cell UPC_i outputs the $i^{th}$ delay clock to an $(i+1)^{th}$ unit pulse cell UPC_(i+1);
   wherein the second clock generator comprises:
      N unit pulse cells UPC_1-UPC_N connected in series, wherein in the second clock generator, an $i^{th}$ unit pulse cell UPC_i samples an $(i-1)^{th}$ pulse signal output by an $(i-1)^{th}$ unit pulse cell UPC_(i-1) according to a first frequency, so as to obtain an $i^{th}$ pulse signal, and the $i^{th}$ unit pulse cell UPC_i outputs the $i^{th}$ pulse signal to an $(i+1)^{th}$ unit pulse cell UPC_(i+1); and
      N programmable width cells PWC_1-PWC_N, wherein in the second clock generator, an $i^{th}$ programmable width cell PWC_i is coupled to the $i^{th}$ unit pulse cell UPC_i for receiving the $i^{th}$ pulse signal, the $i^{th}$ programmable width cell PWC_i adjusts a pulse width of the $i^{th}$ pulse signal according to the second control signal, so as to obtain an $i^{th}$ clock signal $clk_i$ of the clock signals, and the $i^{th}$ programmable width cell PWC_i outputs the $i^{th}$ clock signal $clk_i$ to the switched-capacitor network.

2. The charge-domain filter as claimed in claim 1, wherein the phase differences of the clock signals are adjusted according to the first control signal, and pulses of the clock signals are not overlapped to each other in time.

3. The charge-domain filter as claimed in claim 1, wherein the $i^{th}$ unit pulse cell UPC_i of the first clock generator comprises:
   a pulse generator, sampling the $(i-1)^{th}$ delay clock output by the $(i-1)^{th}$ unit pulse cell UPC_(i-1) according to the first frequency, so as to output the $i^{th}$ clock signal $clk_i$ to the switched-capacitor network; and a programmable delay cell, coupled to the pulse generator for receiving the $i^{th}$ clock signal $clk_i$, wherein the programmable delay cell delays the $i^{th}$ clock signal $clk_i$ according to the first control signal to obtain the $i^{th}$ delay clock, and outputs the $i^{th}$ delay clock to the $(i+1)^{th}$ unit pulse cell UPC_(i+1).

4. The charge-domain filter as claimed in claim 3, wherein the pulse generator comprises:
a flip-flop, having a trigger terminal receiving the first frequency, an input terminal coupled to the $(i-1)^{th}$ unit pulse cell UPC_(i-1) for receiving the $(i-1)^{th}$ delay clock, and an output terminal outputting the $i^{th}$ clock signal $clk_i$ to the switched-capacitor network and the programmable delay cell.

5. The charge-domain filter as claimed in claim 3, wherein the programmable delay cell is a D-type flip-flop string, an inverter chain or a voltage-controlled delay line.

6. The charge-domain filter as claimed in claim 1, wherein the first clock generator further comprises:
a feedback control cell, coupled to the unit pulse cells UPC_1-UPC_N, wherein the feedback control cell provides different feedback paths between the unit pulse cells UPC_1-UPC_N according to a third control signal.

7. The charge-domain filter as claimed in claim 1, wherein the pulse widths of the clock signals are adjusted according to the second control signal, and pulses of the clock signals are adjacent to each other in time.

8. The charge-domain filter as claimed in claim 1, wherein the $i^{th}$ unit pulse cell UPC_i of the second clock generator comprises:
a pulse generator, sampling the $(i-1)^{th}$ pulse signal output by the $(i-1)^{th}$ unit pulse cell UPC_(i-1) according to the first frequency, so as to output the $i^{th}$ pulse signal to the $(i+1)^{th}$ unit pulse cell UPC_(i+1) and the $i^{th}$ programmable width cell PWC_i.

9. The charge-domain filter as claimed in claim 8, wherein the pulse generator comprises:
a flip-flop, having a trigger terminal receiving the first frequency, an input terminal coupled to the $(i-1)^{th}$ unit pulse cell UPC_(i-1) for receiving the $(i-1)^{th}$ pulse signal, and an output terminal outputting the $i^{th}$ pulse signal to the $(i+1)^{th}$ unit pulse cell UPC_(i+1) and the $i^{th}$ programmable width cell PWC_i.

10. The charge-domain filter as claimed in claim 1, wherein the $i^{th}$ programmable width cell PWC_i of the second clock generator comprises:
a delay line, having an input terminal coupled to the $i^{th}$ unit pulse cell UPC_i for receiving the $i^{th}$ pulse signal, wherein a delay time of the delay line is controlled by the second control signal; and
an AND gate, having a first input terminal coupled to the $i^{th}$ unit pulse cell UPC_for receiving the $i^{th}$ pulse signal, a second input terminal coupled to an output terminal of the delay line, and an output terminal outputting the $i^{th}$ clock signal $clk_i$ to the switched-capacitor network.

11. The charge-domain filter as claimed in claim 1, wherein the second clock generator further comprises:
a feedback control cell, coupled to the unit pulse cells UPC_1-UPC_N, wherein the feedback control cell provides different feedback paths between the unit pulse cells UPC_1-UPC_N according to a third control signal.

12. A clock generator, adapted to generate a plurality of clock signals, and the clock generator comprising a first clock generator or a second clock generator;
wherein the first clock generator comprises N unit pulse cells UPC_1-UPC_N connected in series, wherein in the first clock generator, an $i^{th}$ unit pulse cell UPC_i samples an $(i-1)^{th}$ delay clock output by an $(i-1)^{th}$ unit pulse cell UPC_(i-1) according to a first frequency, so as to obtain an $i^{th}$ clock signal $clk_i$ of the clock signals, the $i^{th}$ unit pulse cell UPC_i outputs the $i^{th}$ clock signal $clk_i$ to the switched-capacitor network, the $i^{th}$ unit pulse cell UPC_i delays the $i^{th}$ clock signal $clk_i$ according to the first control signal to obtain an $i^{th}$ delay clock, and the $i^{th}$ unit pulse cell UPC_i outputs the $i^{th}$ delay clock to an $(i+1)^{th}$ unit pulse cell UPC_(i+1);
wherein the second clock generator comprises:
N unit pulse cells UPC_1-UPC_N connected in series, wherein in the second clock generator, an $i^{th}$ unit pulse cell UPC_i samples an $(i-1)^{th}$ pulse signal output by an $(i-1)^{th}$ unit pulse cell UPC_(i-1) according to a first frequency, so as to obtain an $i^{th}$ pulse signal, the $i^{th}$ unit pulse cell UPC_i outputs the $i^{th}$ pulse signal to an $(i+1)^{th}$ unit pulse cell UPC_(i+1); and
N programmable width cells PWC_1-PWC_N, wherein in the second clock generator, an $i^{th}$ programmable width cell PWC_i is coupled to the $i^{th}$ unit pulse cell UPC_i for receiving the $i^{th}$ pulse signal, and the $i^{th}$ programmable width cell PWC_i adjusts a pulse width of the $i^{th}$ pulse signal according to a second control signal, so as to obtain an $i^{th}$ clock signal $clk_i$ of the clock signals.

13. The clock generator as claimed in claim 12, wherein the $i^{th}$ unit pulse cell UPC_i of the first clock generator comprises:
a pulse generator, sampling the $(i-1)^{th}$ delay clock output by the $(i-1)^{th}$ unit pulse cell UPC_(i-1) according to the first frequency, so as to output the $i^{th}$ clock signal; and
a programmable delay cell, coupled to the pulse generator for receiving the $i^{th}$ clock signal, wherein the programmable delay cell delays the $i^{th}$ clock signal according to the first control signal to obtain the $i^{th}$ delay clock, and outputs the $i^{th}$ delay clock to the $(i+1)^{th}$ unit pulse cell UPC_(i+1).

14. The clock generator as claimed in claim 13, wherein the pulse generator comprises:
a flip-flop, having a trigger terminal receiving the first frequency, an input terminal coupled to the $(i-1)^{th}$ unit pulse cell UPC_(i-1) for receiving the $(i-1)^{th}$ delay clock, and an output terminal outputting the $i^{th}$ clock signal.

15. The clock generator as claimed in claim 13, wherein the programmable delay cell is a D-type flip-flop string, an inverter chain or a voltage-controlled delay line.

16. The charge-domain filter as claimed in claim 12, wherein the first clock generator further comprises:
a feedback control cell, coupled to the unit pulse cells UPC_1-UPC_N, wherein the feedback control cell provides different feedback paths between the unit pulse cells UPC_1-UPC_N according to a third control signal.

17. The charge-domain filter as claimed in claim 12, wherein the $i^{th}$ unit pulse cell UPC_i of the second clock generator comprises:
a pulse generator, sampling the $(i-1)^{th}$ pulse signal output by the $(i-1)^{th}$ unit pulse cell UPC_(i-1) according to the first frequency, so as to output the $i^{th}$ pulse signal to the $(i+1)^{th}$ unit pulse cell UPC_(i+1) and the $i^{th}$ programmable width cell PWC_i.

18. The charge-domain filter as claimed in claim 17, wherein the pulse generator comprises:
a flip-flop, having a trigger terminal receiving the first frequency, an input terminal coupled to the $(i-1)^{th}$ unit pulse cell UPC_(i-1) for receiving the $(i-1)^{th}$ pulse signal, and an output terminal outputting the $i^{th}$ pulse signal to the $(i+1)^{th}$ unit pulse cell UPC_(i+1) and the $i^{th}$ programmable width cell PWC_i.

19. The charge-domain filter as claimed in claim 12, wherein the $i^{th}$ programmable width cell PWC_i of the second clock generator comprises:
   a delay line, having an input terminal coupled to the $i^{th}$ unit pulse cell UPC_i for receiving the $i^{th}$ pulse signal, wherein a delay time of the delay line is controlled by the second control signal; and
   an AND gate, having a first input terminal coupled to the $i^{th}$ unit pulse cell UPC_i for receiving the $i^{th}$ pulse signal, a second input terminal coupled to an output terminal of the delay line, and an output terminal outputting the $i^{th}$ clock signal $clk_i$.

20. The charge-domain filter as claimed in claim 12, wherein the second clock generator further comprises:
   a feedback control cell, coupled to the unit pulse cells UPC_1-UPC_N, wherein the feedback control cell provides different feedback paths between the unit pulse cells UPC_1-UPC_N according to a third control signal.

21. A charge-domain filtering method, comprising:
   receiving an input signal by a switched-capacitor network, and sampling the input signal according to a plurality of clock signals, wherein the clock signals have different phases; and
   adjusting phase differences and pulse widths of the clock signals generated by a clock generator according to at least one control signal, wherein the clock generator comprises a first clock generator or a second clock generator;
   wherein the first clock generator comprises N unit pulse cells UPC_1-UPC_N connected in series, wherein in the first clock generator, an $i^{th}$ unit pulse cell UPC_i samples an $(i-1)^{th}$ delay clock output by an $(i-1)^{th}$ unit pulse cell UPC_(i-1) according to a first frequency, so as to obtain an $i^{th}$ clock signal $clk_i$ of the clock signals, the $i^{th}$ unit pulse cell UPC_i outputs the $i^{th}$ clock signal $clk_i$ to the switched-capacitor network, the $i^{th}$ unit pulse cell UPC_i delays the $i^{th}$ clock signal $clk_i$ according to the first control signal to obtain an $i^{th}$ delay clock, and the $i^{th}$ unit pulse cell UPC_i outputs the $i^{th}$ delay clock to an $(i+1)^{th}$ unit pulse cell UPC_(i+1);
   wherein the second clock generator comprises:
   N unit pulse cells UPC_1-UPC_N connected in series, wherein in the second clock generator, an $i^{th}$ unit pulse cell UPC_i samples an $(i-1)^{th}$ pulse signal output by an $(i-1)^{th}$ unit pulse cell UPC_(i-1) according to a first frequency, so as to obtain an $i^{th}$ pulse signal, and the $i^{th}$ unit pulse cell UPC_i outputs the $i^{th}$ pulse signal to an $(i+1)^{th}$ unit pulse cell UPC_(i+1); and
   N programmable width cells PWC_1-PWC_N, wherein in the second clock generator, an $i^{th}$ programmable width cell PWC_i is coupled to the $i^{th}$ unit pulse cell UPC_i for receiving the $i^{th}$ pulse signal, the $i^{th}$ programmable width cell PWC_i adjusts a pulse width of the $i^{th}$ pulse signal according to the second control signal, so as to obtain an $i^{th}$ clock signal $clk_i$ of the clock signals, and the $i^{th}$ programmable width cell PWC_i outputs the $i^{th}$ clock signal $clk_i$ to the switched-capacitor network.

22. The charge-domain filtering method as claimed in claim 21, wherein the phase differences of the clock signals are adjusted, and pulses of the clock signals are not overlapped to each other in time.

23. The charge-domain filtering method as claimed in claim 21, wherein the pulse widths of the clock signals are adjusted, and pulses of the clock signals are adjacent to each other in time.

* * * * *